United States Patent [19]

Iwasa et al.

[11] Patent Number: 5,703,381
[45] Date of Patent: Dec. 30, 1997

[54] SEMICONDUCTOR INTEGRATED CIRCUIT

[75] Inventors: Kiyoaki Iwasa, Tokyo; Shigeo Ohshima, Yokohama, both of Japan

[73] Assignee: Kabushiki Kaisha Toshiba, Kawasaki, Japan

[21] Appl. No.: 557,731

[22] Filed: Nov. 13, 1995

[30] Foreign Application Priority Data

Nov. 18, 1994 [JP] Japan ................. 6-285361

[51] Int. Cl.$^6$ ................................. H01L 23/58
[52] U.S. Cl. ................. 257/48; 437/8; 324/769; 324/158.1; 257/401
[58] Field of Search ................. 257/48, 204, 208, 257/401; 437/8; 324/765, 769, 158.1

[56] References Cited

U.S. PATENT DOCUMENTS 4,931,844  6/1990  Zommer ................. 257/48
5,250,823  10/1993  Veendrick et al. ................. 257/204

*Primary Examiner*—Jerome Jackson
*Assistant Examiner*—John Guay
*Attorney, Agent, or Firm*—Foley & Lardner

[57] ABSTRACT

A semiconductor integrated circuit includes a rectangular semiconductor chip having a main surface, a plurality of pads formed in a peripheral portion of the main surface of the semiconductor chip, for connection to external connecting members, a plurality of circuit elements of an integrated circuit formed in an area of the main surface other than an area in which the plurality of pads are formed, and at least one characteristic evaluating circuit element connected to at least one of the plurality of circuit elements of the integrated circuit by sharing an impurity doped region which forms part of the at least one circuit element with the at least one circuit element of the integrated circuit in an area of the main surface other than the peripheral portion in which the plurality of pads are formed.

11 Claims, 3 Drawing Sheets

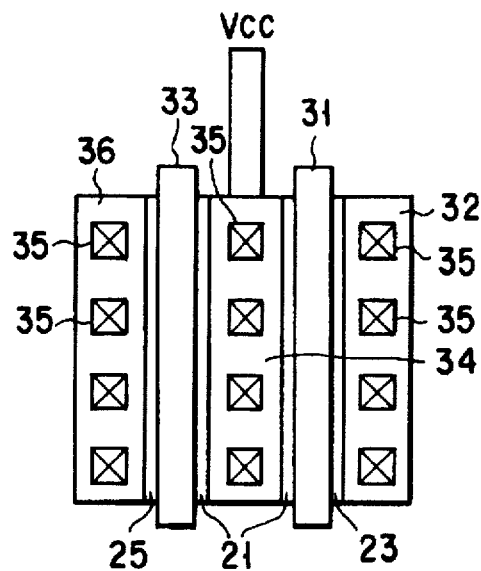
F I G. 6
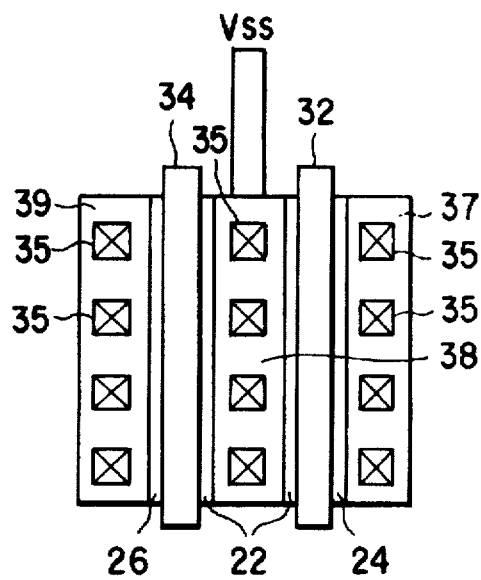
F I G. 7
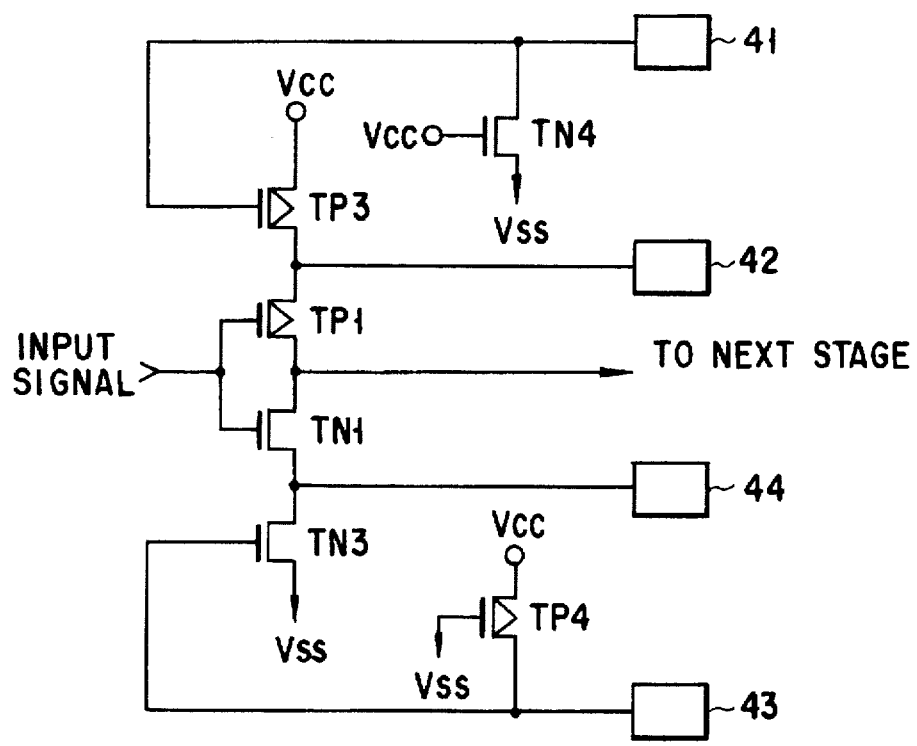
F I G. 8

SEMICONDUCTOR INTEGRATED CIRCUIT

BACKGROUND OF THE INVENTION

1. Field of the Invention

This invention relates to a semiconductor integrated circuit including MOS transistors, and more particularly to an integrated circuit containing MOS transistors for a TEG (Test Element Group) formed for measuring the characteristic of a MOS transistor group of a preset circuit.

2. Description of the Related Art

Generally, when a MOS integrated circuit is manufactured, MOS transistors called a TEG for equivalently measuring the resistivity of a substrate and the characteristic of MOS transistors formed on the substrate and pads connected to the MOS transistors are formed on a wafer on which an integrated circuit chip will be formed in order to evaluate the process. The characteristics of MOS transistors obtained from a TEG is also used as data for a simulation.

Such a TEG is arranged in a boundary portion (on the scribe line) between the chips or in an area between pads formed along the periphery of the chip. In either case, the conventional TEG transistor is formed in an area formed at a relatively far distance from an area in which a MOS transistor group for circuit construction is formed.

Since the transistors in the MOS transistor group for circuit construction are generally formed at a high density and the TEG transistors are formed at a low density, the dimensions of the above two types of transistors are made different because of the process conditions.

That is, when a pattern of elements such as transistors is formed on the semiconductor substrate, light incident on the photoresist on one surface of the wafer spreads into the semiconductor substrate while it collides against organic molecules and is scattered in a forward direction. Part of the light entering the substrate is reflected, scattered in a backward direction as secondary photons and fed back into the photoresist. Thus, the photoresist is exposed to the light and the thickness of the resist pattern is reduced, and transistors whose pattern is determined by the resist pattern are formed with dimensions different from the desired dimensions.

Thus, since the dimensions of the transistors for circuit construction formed at a high density and the dimensions of the TEG transistors formed at a low density are different from each other, it becomes difficult to correctly evaluate the characteristics of the transistors for circuit construction by measuring the characteristics of the TEG transistors.

Further, if the TEG transistor is formed on the scribe line, the TEG transistor is destroyed when the chip area is cut apart from the wafer and separated. Therefore, when the characteristics of the transistors is evaluated after the chips are assembled, characteristic measurement by the TEG becomes impossible and it becomes impossible to obtain measurement data of the TEG transistors provided in one-to-one correspondence to the chips for the respective chips.

Thus, the TEG transistors formed in the conventional semiconductor integrated circuit have dimensions different from those of the transistors of the MOS transistor group for circuit construction, and it is difficult to correctly evaluate the characteristic of the transistors for circuit construction by measuring the characteristic of the TEG transistors.

Further, if the conventional TEG MOS transistor is formed on the scribe line of the semiconductor wafer, there occurs a problem that characteristic measurements cannot be made at the time of evaluation after assembling the chips, and measurement data of the TEG transistors provided in one-to-one correspondence to the respective chips cannot be obtained.

SUMMARY OF THE INVENTION

An object of this invention is to provide a semiconductor integrated circuit in which TEG MOS transistors and MOS transistors for circuit construction can be formed with substantially the same dimensions and the characteristics of the transistors for circuit construction can be correctly evaluated by measuring the characteristics of the TEG transistors.

In order to attain the above object, a semiconductor integrated circuit of this invention comprises a rectangular semiconductor chip having a main surface; a plurality of pads formed in a peripheral portion of the main surface of the semiconductor chip, for connection to external connecting members; a plurality of circuit elements for an integrated circuit formed in an area of the main surface except the peripheral portion in which the plurality of pads is formed; and at least one characteristic evaluating circuit element connected to at least one of the circuit elements of the integrated circuit by sharing an impurity doped region which forms part of the at least one of the circuit elements, with the at least one of the circuit elements of the integrated circuit in an area of the main surface not including the peripheral portion in which the plurality of pads are formed.

The circuit of the circuit elements of the integrated circuit is formed such that the at least one characteristic measuring circuit element will be electrically isolated from the plurality of circuit elements of the integrated circuit at the time of characteristic measurement.

Further, the at least one characteristic evaluating circuit element is connected to part of the circuit elements of the integrated circuit so as to be independent of the normal operation of the integrated circuit when the integrated circuit effects the normal operation.

It is preferable that the plurality of circuit elements of the integrated circuit include at least one PMOS transistor and at least one NMOS transistor and the at least one characteristic evaluating circuit element includes a PMOS transistor sharing the impurity doped region as a source/drain region with the PMOS transistor of the integrated circuit and an NMOS transistor sharing the impurity doped region as a source/drain region with the NMOS transistor of the integrated circuit.

The characteristic measuring MOS transistor and the circuit constructing MOS transistor commonly use a diffusion layer in the substrate which is part of the above MOS transistors and the above MOS transistors are arranged close to each other. With this arrangement, the above MOS transistors will be formed with substantially the same dimensions if the dimensions of the exposure patterns for the MOS transistors are equal to each other at the time of manufacturing of the integrated circuit, and it becomes possible to correctly evaluate the characteristics of the circuit constructing MOS transistor by measuring the characteristics of the TEG MOS transistor and feed back the result of evaluation to the circuit design.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a diagram showing one example of a plane pattern of a TEG PMOS transistor and a circuit constructing PMOS transistor in FIG. 5;

FIG. 7 is a diagram showing one example of a plane pattern of a TEG NMOS transistor and a circuit constructing NMOS transistor in FIG. 5; and FIG. 8 is a circuit diagram showing part of a semiconductor integrated circuit according to a second embodiment of this invention.

DETAILED DESCRIPTION OF THE PREFERRED EMBODIMENTS

Before explaining the embodiment of this invention, the conventional TEG forming method is explained. Generally, the exposing process is repeatedly effected according to a shot map as shown in FIG. 2 by using a reticule having three chips as one unit as shown in FIG. 1 as mask data when the integrated circuit pattern is formed on the semiconductor wafer.

Figure 1:
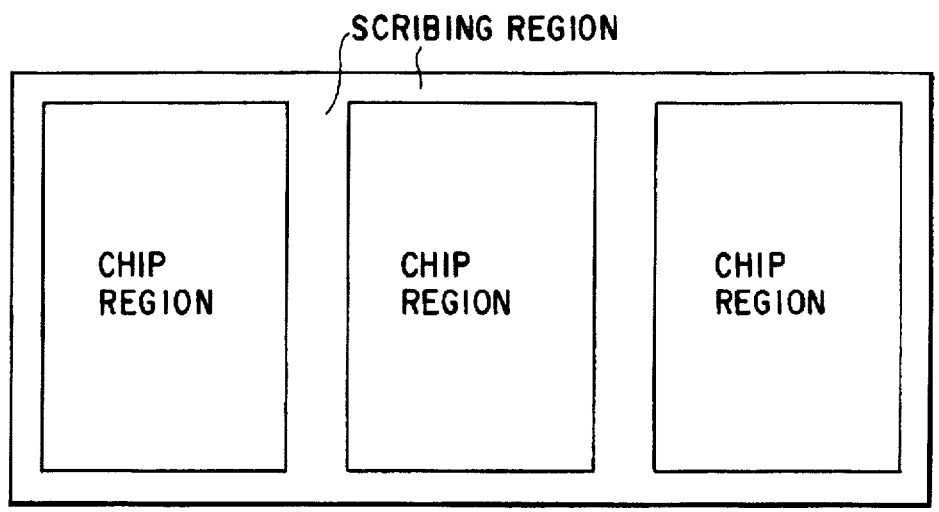
FIG. 1 is a diagram showing one example of a 3-chip reticule corresponding to mask data used when an integrated circuit pattern is formed on a semiconductor wafer.
Figure 2:
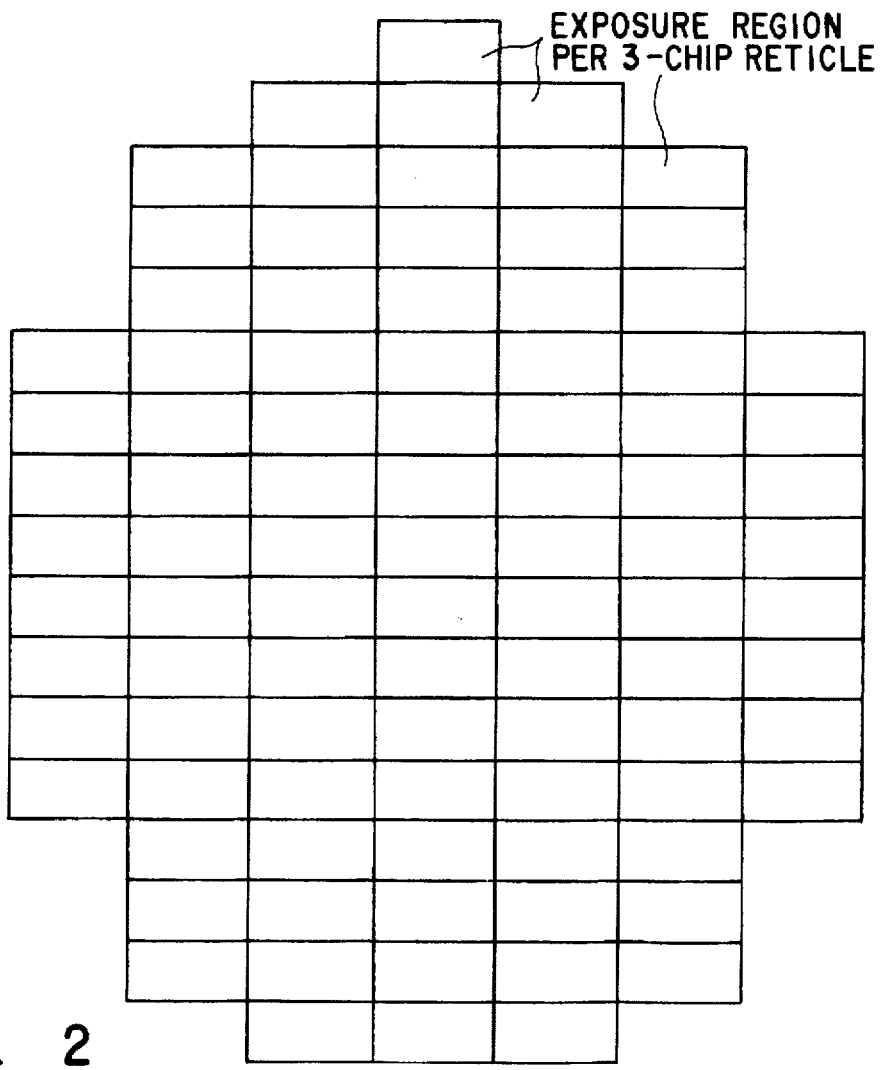
FIG. 2 is a diagram showing one example of a shot map used for repeatedly effecting the exposing process when the integrated circuit pattern is formed on the semiconductor wafer.
Figure 3:
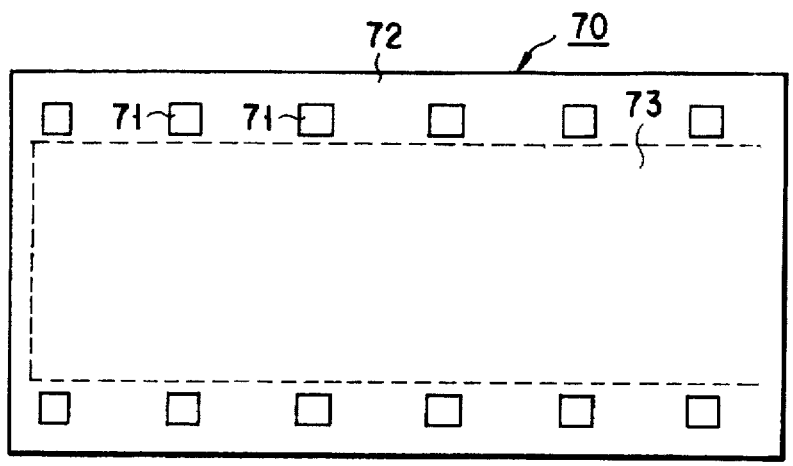
FIG. 3 is a diagram showing one example of the arrangement of TEGs in an area between pads in the chip area in the conventional integrated circuit.

As shown in FIG. 1, the TEG provided for evaluation is arranged in a boundary portion (on the scribe line) between the chip areas as shown in FIG. 1 or in an area 72 between pads 71 in the chip area 70 as shown in FIG. 3. In either case, the conventional TEG transistor is formed in an area set at a relatively far distance from an area 73 (area surrounded by broken lines) in which a circuit constructing MOS transistor group is formed.

Figure 4:
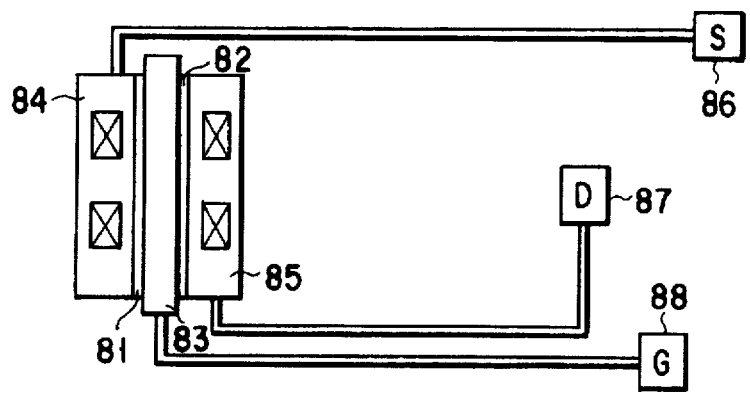
FIG. 4 is a diagram showing one example of a plane pattern of TEG MOS transistor in the conventional integrated circuit.

FIG. 4 shows one example of a plane pattern of the conventional TEG MOS transistor. In FIG. 4, reference numerals 81 and 82 denote impurity diffusion layers formed in the semiconductor substrate and constructing source and drain regions of the MOS transistor. A reference numeral 83 denotes the gate electrode of the MOS transistor, 84 and 85 denote interconnection layers formed in contact with the source and drain regions, 86 to 88 denote pads for measurement respectively connected to the source region 81, drain region 82 and gate electrode 83. The characteristics of the TEG transistor are measured via the measuring pads.

The TEG MOS transistor formed in the conventional semiconductor integrated circuit has different dimensions from those of each transistor in the circuit constructing MOS transistor group. Therefore it is difficult to correctly evaluate the characteristics of the circuit constructing transistors by measuring the characteristics of the TEG transistor.

Further, in a case where the conventional TEG MOS transistor is formed on the scribe line of the semiconductor wafer, the characteristic measurement cannot be made at the time of evaluation of the chip assembly, and measurement data of the TEG MOS transistors provided in one-to-one correspondence to the chips for the respective chips cannot be obtained.

This invention has been made to solve the above problems. In accordance with the invention, there is provided a semiconductor integrated circuit in which TEG MOS transistors and MOS transistors for circuit construction can be formed with substantially the same dimensions so that the characteristics of the transistors for circuit construction can be correctly evaluated by measuring the characteristic of the TEG transistors. There will now be described an embodiment of this invention with reference to the accompanying drawings.

Embodiment 1

Figure 5:
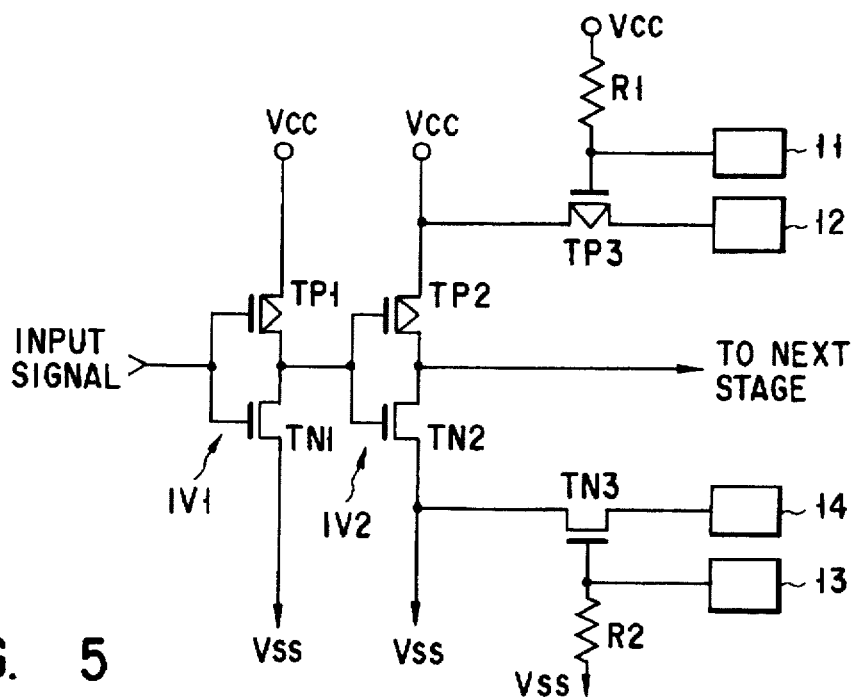
FIG. 5 is a circuit diagram showing part of a semiconductor integrated circuit according to a first embodiment of this invention.

FIG. 5 shows a plurality of MOS transistors for circuit construction formed in part of a circuit forming area on the chip of the semiconductor integrated circuit according to a first embodiment of this invention, including TEGs formed near the MOS transistors. FIG. 6 shows one example of a plane pattern of a TEG PMOS transistor and a circuit constructing PMOS transistor in FIG. 5. FIG. 7 shows one example of a plane pattern of a TEG NMOS transistor and a circuit constructing NMOS transistor in FIG. 5.

As shown in FIG. 5, a plurality of MOS transistors TPi, TNi (i=1, 2) for circuit construction constitute two CMOS inverter circuits IV1, IV2, for example, and the CMOS inverter circuits IV1, IV2 are cascade-connected to transfer an input signal from the preceding-stage circuit to the next-stage circuit. In this case, in each of the CMOS inverter circuits, the gates of the PMOS transistor TPi and the NMOS transistor TNi are connected together, the source of the PMOS transistor TPi is connected to a power supply terminal (power supply potential VCC), and the source of the NMOS transistor TNi is connected to a ground terminal (ground potential VSS).

The circuit constructing MOS transistor TPi has a normal structure, and like the pattern shown in FIG. 6, the source region is formed of a first impurity diffusion layer 21 formed in the semiconductor substrate in the circuit forming area (except the area between the pads) of the integrated circuit chip, the drain region is formed of a third impurity diffusion layer 23 and it has a gate electrode 31. A reference numeral 32 denotes a drain electrode formed on the impurity diffusion layer 23 and connected to the impurity diffusion layer 23 via contacts 35. Likewise, a reference numeral 34 denotes a source electrode formed on the impurity diffusion layer 21 and connected to the impurity diffusion layer 21 via other contacts 35.

The circuit constructing MOS transistor TNi has a normal structure, and like the pattern shown in FIG. 7, the source region is formed of a second impurity diffusion layer 22 formed in the semiconductor substrate, the drain region is formed of a fourth impurity diffusion layer 24 and it has a gate electrode 32. A reference numeral 37 denotes a drain electrode formed on the impurity diffusion layer 24 and connected to the impurity diffusion layer 23 via contacts 35. Likewise, a reference numeral 38 denotes a source electrode formed on the impurity diffusion layer 22 and connected to the impurity diffusion layer 22 via other contacts 35.

The TEG includes a plurality of TEG MOS transistors (in this example, one PMOS transistor TP3 and one NMOS transistor TN3), a plurality of resistors (in this example, a first resistor R1 and a second resistor R2), and a plurality of pads (in this example, first to fourth pads 11 to 14).

The TEG MOS transistor and the circuit constructing MOS transistor share a diffusion layer formed in the substrate constructing part thereof and the MOS transistors are arranged close to each other.

That is, the TEG MOS transistor TP3 shares the first impurity diffusion layer 21 as the source region with the PMOS transistor TP2 of the CMOS inverter circuit IV2 on the latter-stage side as shown by the pattern of FIG. 6, and the drain region thereof is formed of a fifth impurity diffusion layer 25 and has a gate electrode 33. A reference numeral 36 denotes a drain electrode formed on the impurity diffusion layer 25 and connected to the impurity diffusion layer 25 via contacts 35. It is preferable to form the impurity diffusion layers 23 and 25 (the drain region of the circuit constructing transistor and the drain region of the TEG transistor) with the same dimensions.

In this example, the source of the TEG PMOS transistor TP3 is connected to the VCC terminal together with the source of the circuit constructing PMOS transistor TP2, the gate electrode thereof is connected to a first pad 11 and the drain thereof is connected to a second pad 12.

Further, the TEG MOS transistor TN3 shares the second impurity diffusion layer 22 as the source region with the NMOS transistor TN2 of the CMOS inverter circuit IV2 on the latter-stage side as shown by the pattern of FIG. 7, and the drain region thereof is formed of a sixth impurity diffusion layer 26 and has a gate electrode 34. A reference numeral 39 denotes a drain electrode formed on the impurity diffusion layer 26 and connected to the impurity diffusion layer 26 via other contacts 35. It is preferable to form the impurity diffusion layers 24 and 26 (the drain region of the circuit constructing transistor and the drain region of the TEG transistor) with the same dimensions.

In this example, the source of the TEG NMOS transistor TN3 is connected to the VSS terminal together with the source of the circuit constructing NMOS transistor TN2, the gate electrode thereof is connected to a third pad 13 and the drain thereof is connected to a fourth pad 14. The first resistor R1 is connected between the gate of the TEG PMOS transistor TP3 and the VCC terminal, and the second resistor R2 is connected between the gate of the TEG NMOS transistor TN3 and the VSS terminal.

When a preset potential is applied to the first pad 11 from the exterior, the first resistor R1 exhibits a high resistance such that the above potential will be applied to the gate of the TEG PMOS transistor TP3, but when no potential is applied to the first pad 11 from the exterior, it pulls up the gate potential of the TEG PMOS transistor TP3 to the power supply potential VCC so as to prevent the gate from being set into an electrically floating state.

Further, when a preset potential is applied to the third pad 13 from the exterior, the second resistor R2 exhibits a high resistance such that the above potential will be applied to the gate of the TEG NMOS transistor TN3, but when no potential is applied to the third pad 13 from the exterior, it pulls down the gate potential of the TEG NMOS transistor TN3 to the ground potential VSS so as to prevent the gate from being set into an electrically floating state.

In the circuit with the above construction, no potential is applied to the pads 11 to 14 from the exterior in the normal operating condition. At this time, the TEG PMOS transistor TP3 is turned OFF since the gate thereof is pulled up to the power supply potential VCC, the TEG NMOS transistor TN3 is turned OFF since the gate thereof is pulled down to the ground potential VSS, and the cascade-connected two-stage CMOS inverter circuits IV1, IV2 transfer an input signal from the preceding-stage circuit to the next-stage circuit.

On the other hand, at the time of measurement of the TEG PMOS transistor TP3, a preset potential is applied to the first pad 11 from the exterior while an input signal is set so as to turn OFF the PMOS transistor TP2 of the latter-stage CMOS inverter circuit IV2. At this time, it becomes possible to measure a current flowing in the TEG PMOS transistor TP3 between the VCC terminal and the second pad 12 from the exterior.

Likewise, at the time of measurement of the TEG NMOS transistor TN3, a preset potential is applied to the third pad 13 from the exterior while an input signal is so set as to turn OFF the NMOS transistor TN2 of the latter-stage CMOS inverter circuit IV2. At this time, it becomes possible to measure a current flowing in the TEG NMOS transistor TN3 between the fourth pad 14 and the VSS terminal from the exterior.

According to the integrated circuit of the first embodiment, the position in which the TEG MOS transistors TP3, TN3 are arranged is not set on the scribe line or in an area between the pads unlike the conventional case. That is, the TEG MOS transistor TP3 is formed in the formation area of the circuit constructing transistor and shares a diffusion layer in the substrate which constructs part of the MOS transistor TP2 with the circuit constructing MOS transistor TP2. The above two transistors are arranged close to each other. Likewise, the TEG MOS transistor TN3 shares a diffusion layer in the substrate which constructs part of the MOS transistor TN2 with the circuit constructing MOS transistor TN2 and the transistors are arranged close to each other.

With the above arrangement, the TEG MOS transistor and the circuit constructing MOS transistor will be formed with substantially the same dimensions if the dimensions of the exposure patterns for the above MOS transistors are equal to each other at the time of manufacturing of the integrated circuit. Therefore, it becomes possible to correctly evaluate the characteristics of the circuit constructing MOS transistor by measuring the characteristics of the TEG MOS transistor and to feed back the result of evaluation to the circuit design.

Embodiment 2

FIG. 8 shows a plurality of circuit constructing MOS transistors formed in part of the circuit forming area of a semiconductor integrated circuit according to a second embodiment of this invention including a TEG formed near the MOS transistors.

As shown in FIG. 8, a plurality of circuit constructing MOS transistors construct one CMOS inverter circuit IV1 which is connected to transfer an input signal from the preceding-stage circuit to the next-stage circuit. In this case, in the CMOS inverter circuit IV1, the gates of a PMOS transistor TP1 and an NMOS transistor TN1 are connected together.

The plurality of circuit constructing MOS transistors TP1, TN1 have the normal structures in which the source regions and drain regions thereof are formed as impurity diffusion layers in the semiconductor substrate.

The TEG includes a plurality of TEG MOS transistors (in this example, one PMOS transistor TP3 and one NMOS transistor TN3), a plurality of TEG pads (in this example, first to fourth pads 41 to 44), one pull-down NMOS transistor TN4, and one pull-up PMOS transistor TP4.

In this example, the source of the TEG PMOS transistor TP3 is connected to a power supply terminal, the gate thereof is connected to the first pad 41, and the drain thereof commonly uses an impurity diffusion layer with the source of the PMOS transistor TP1 of the CMOS inverter circuit IV1 and is connected to the second pad 42.

Further, the source of the TEG NMOS transistor TN3 is connected to a ground terminal, the gate thereof is connected to the third pad 43, and the drain thereof shares an impurity diffusion layer with the source of the NMOS transistor TN1 of the CMOS inverter circuit IV1 and is connected to the fourth pad 44.

The gate of the pull-down NMOS transistor TN4 is connected to the power supply terminal, and the drain-source path thereof is connected between the gate of the TEG PMOS transistor TP3 and the ground terminal.

Further, the gate of the pull-up PMOS transistor TP4 is connected to the ground node, and the source-drain path thereof is connected between the power supply terminal and the gate of the TEG NMOS transistor TN3.

The pull-down NMOS transistor TN4 and pull-up PMOS transistor TP4 are formed with a size and gate width which are substantially larger than those of the other MOS transistors so as to stably effect the pull-down operation and pull-up operation, respectively.

Therefore, the pull-down NMOS transistor TN4 pulls down the gate potential of the TEG PMOS transistor TP3 to the ground potential VSS so as to prevent the gate from being set into an electrically floating state when no potential is applied to the first pad 41 from the exterior. When a preset potential is applied to the first pad 41 from the exterior, the potential is applied to the gate of the TEG PMOS transistor TP3 without any trouble.

Likewise, the pull-up PMOS transistor TP4 has a function of pulling up the gate potential of the TEG NMOS transistor TN3 to the power supply potential VCC when no preset potential is applied to the third pad 43 from the exterior, but when a potential is applied to the third pad 43 from the exterior, the potential is applied to the gate of the TEG NMOS transistor TN3 without any trouble.

In a circuit with the above construction, no potential is applied to the pads 41 to 44 at the time of normal operation. At this time, since the gate potential of the TEG PMOS transistor TP3 is pulled down to the ground potential VSS, the TEG PMOS transistor TP3 is turned ON, and since the gate potential of the TEG NMOS transistor TN3 is pulled up to VCC, the TEG NMOS transistor TN3 is turned ON, and the CMOS inverter circuit IV1 transfers an input signal from the preceding-stage circuit to the next-stage circuit.

On the other hand, at the time of measurement of the TEG PMOS transistor TP3, a preset potential is applied to the first pad 41 from the exterior while an input signal is set to turn OFF the PMOS transistor TP1 of the CMOS inverter circuit IV1. At this time, it becomes possible to measure a current flowing in the TEG PMOS transistor TP3 between the power supply node and the second pad 42 from the exterior.

Likewise, at the time of measurement of the TEG NMOS transistor TN3, a preset potential is applied to the third pad 43 from the exterior while an input signal is controlled and set to turn OFF the NMOS transistor TN1 of the CMOS inverter circuit IV1. At this time, it becomes possible to measure a current flowing in the TEG NMOS transistor TN3 between the fourth pad 44 and the ground node from the exterior. Therefore, according to the circuit of the second embodiment, the same effect as that obtained in the circuit of the first embodiment can be attained.

As described above, according to this invention, it is possible to provide a semiconductor integrated circuit in which the TEG MOS transistor and the circuit constructing MOS transistor can be formed with substantially the same dimensions and the characteristics of the circuit constructing transistor can be correctly evaluated by measuring the characteristics of the TEG transistor.

Additional advantages and modifications will readily occur to those skilled in the art. Therefore, the invention in its broader aspects is not limited to the specific details and representative devices shown and described herein. Accordingly, various modifications may be made without departing from the spirit or scope of the general inventive concept as defined by the appended claims and their equivalents.

What is claimed is:

1. A semiconductor integrated circuit comprising:
   a rectangular semiconductor chip having a main surface;
   a plurality of pads formed in a peripheral portion of the main surface of said semiconductor chip, for connection to external connecting members;
   a plurality of circuit elements of an integrated circuit formed in an area of the main surface other than the peripheral portion in which said plurality of pads are formed; and
   at least two characteristic evaluating circuit elements including at least one PMOS transistor and at least one NMOS transistor, said at least one PMOS transistor sharing an impurity doped region as a source/drain region with said PMOS transistor of said integrated circuit and said NMOS transistor sharing an impurity doped region as a source/drain region with said NMOS transistor of said integrated circuit, said at least two characteristic evaluating circuit elements being located in an area of the main surface other than the peripheral portion in which said plurality of pads are formed.

2. A semiconductor integrated circuit according to claim 1, wherein said circuit elements of said integrated circuit include circuit means for electrically isolating said at least two characteristic evaluating circuit elements from said plurality of circuit elements of said integrated circuit at a time of characteristic measurement.

3. A semiconductor integrated circuit according to claim 1, wherein said at least two characteristic evaluating circuit elements are connected to part of said circuit elements of said integrated circuit so as to be independent from normal operation of the integrated circuit when the integrated circuit effects normal operation.

4. A semiconductor integrated circuit according to claim 1, wherein said plurality of circuit elements of said integrated circuit include at least one PMOS transistor, and said at least two characteristic evaluating circuit elements include a PMOS transistor sharing an impurity doped region as a source/drain region with said PMOS transistor of said integrated circuit.

5. A semiconductor integrated circuit according to claim 4, further comprising a first test pad connected to the gate of said PMOS transistor for characteristic evaluating, and at least one second test pad connected to the source/drain region of said PMOS transistor for characteristic evaluating.

6. A semiconductor integrated circuit according to claim 1, wherein said plurality of circuit elements of said integrated circuit include at least one NMOS transistor, and said at least two characteristic evaluating circuit elements include an NMOS transistor sharing an impurity doped region as a source/drain region with said NMOS transistor of said integrated circuit.

7. A semiconductor integrated circuit according to claim 6, further comprising a first test pad connected to the gate of said NMOS transistor for characteristic evaluating, and at least one second test pad connected to the source/drain region of said NMOS transistor for characteristic evaluating.

8. A semiconductor integrated circuit according to claim 1, further comprising a first test pad connected to the gate of said PMOS transistor for characteristic evaluating, at least one second test pad connected to the source/drain region of said PMOS transistor for characteristic evaluating, a third test pad connected to the gate of said NMOS transistor for characteristic evaluating, and at least one fourth test pad connected to the source/drain region of said NMOS transistor for characteristic evaluating.

9. A semiconductor integrated circuit comprising:

a semiconductor substrate having an area in which an integrated circuit is formed;

a PMOS transistor of a circuit formed in said semiconductor substrate of the circuit forming area of the integrated circuit having a first source region formed of a first impurity diffusion layer, a first drain region, and a first gate electrode;

an NMOS transistor of said circuit formed in said semiconductor substrate of the circuit forming area of the integrated circuit having a second source region formed of a second impurity diffusion layer, a second drain region, and a second gate electrode;

a PMOS transistor of a test element sharing said first source region formed of the first impurity diffusion layer with said PMOS transistor of said circuit and having a third drain region and a third gate electrode; and an NMOS transistor of a test element sharing said second source region formed of the second impurity diffusion layer with said NMOS transistor of said circuit and having a fourth drain region and a fourth gate electrode;

a first test pad connected to the third gate electrode of said PMOS transistor of said test element;

a second test pad connected to the third drain region of said PMOS transistor of said test element;

a third test pad connected to the fourth gate electrode of said NMOS transistor of said test element; and a fourth test pad connected to the fourth drain region of said NMOS transistor of said test element;

said pMOS and NMOS transistors of said circuit constituting a CMOS inverter circuit which has an input terminal connected to the first and second gate electrodes and an output terminal connected to the first and second drain regions, the first source region commonly used by said PMOS transistor of said test element being connected to the power supply terminal and the second source region commonly used by said NMOS transistor of said test element being connected to reference potential terminal.

10. A semiconductor integrated circuit according to claim 9, further comprising:

a first load element connected between the third gate electrode of said PMOS transistor of said test element and the power supply terminal; and a second load element connected between the fourth gate electrode of said NMOS transistor of said test element and the reference potential terminal.

11. A semiconductor integrated circuit according to claim 10, wherein said first and second load elements are resistors.

* * * * *